US011419235B2

(12) United States Patent
Anderson et al.

(10) Patent No.: US 11,419,235 B2
(45) Date of Patent: Aug. 16, 2022

(54) VIBRATION SHOCK MITIGATION FOR COMPONENTS IN A SERVER RACK

(71) Applicant: International Business Machines Corporation, Armonk, NY (US)

(72) Inventors: Ryan Anderson, Rochester, MN (US); Jessica R. Eidem, Rochester, MN (US); Phillip V. Mann, Rochester, MN (US); Marvin M. Misgen, Rochester, MN (US); Stephen P. Mroz, Rochester, MN (US); Michael O'Connell, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 782 days.

(21) Appl. No.: 15/806,086

(22) Filed: Nov. 7, 2017

(65) Prior Publication Data

US 2019/0141852 A1    May 9, 2019

(51) Int. Cl.
*H05K 7/14* (2006.01)
*H05K 7/18* (2006.01)

(52) U.S. Cl.
CPC ......... *H05K 7/1489* (2013.01); *H05K 7/1495* (2013.01); *H05K 7/183* (2013.01)

(58) Field of Classification Search
CPC ............... H05K 7/1489; H05K 7/1488; H05K 13/0069; H05K 7/1427; H05K 7/1461; H05K 7/1485; H05K 7/1487; H05K 7/18; H05K 7/183; H05K 7/1495
See application file for complete search history.

(56) References Cited

U.S. PATENT DOCUMENTS

| | | | | |
|---|---|---|---|---|
| 5,794,794 A | * | 8/1998 | Hull | H05K 7/18 211/187 |
| 6,478,166 B2 | * | 11/2002 | Hung | H05K 7/183 211/175 |
| 6,586,058 B1 | | 7/2003 | Etzold | |
| 6,641,359 B1 | | 11/2003 | Marti et al. | |
| 6,655,533 B2 | * | 12/2003 | Guebre-Tsadik | H05K 7/186 211/175 |
| 6,666,340 B2 | | 12/2003 | Basinger et al. | |
| 7,699,180 B2 | * | 4/2010 | Mollard | B65D 19/44 211/26 |
| 8,116,076 B2 | | 2/2012 | Cochrane | |
| 8,248,777 B2 | | 8/2012 | Prest | |

(Continued)

FOREIGN PATENT DOCUMENTS

EP    0708032 A2    4/1996

*Primary Examiner* — Rockshana D Chowdhury
(74) *Attorney, Agent, or Firm* — Nathan M. Rau

(57) ABSTRACT

Vibration shock mitigation for components in a server rack includes a server rack comprising: a first server component chassis and a second server component chassis installed in adjacent locations within the server rack; and a chassis gap filler comprising: an elastic dampening sheet configured for placement between the first server component chassis and the second server component chassis, wherein the elastic dampening sheet is further configured to cover a portion of one side of the first server component chassis; and at least two attachment points configured to secure the elastic dampening sheet to the server rack.

11 Claims, 11 Drawing Sheets

(56) References Cited

U.S. PATENT DOCUMENTS

| | | | | |
|---|---|---|---|---|
| 8,833,711 | B2* | 9/2014 | Fritz | A47B 95/00 |
| | | | | 211/175 |
| 9,572,279 | B2* | 2/2017 | Tabe | H05K 7/1497 |
| 9,950,834 | B2* | 4/2018 | Tunks | H05K 7/1488 |
| 2003/0150823 | A1* | 8/2003 | Dean | H05K 7/1489 |
| | | | | 361/826 |
| 2007/0165328 | A1* | 7/2007 | Acciardi | G11B 25/043 |
| | | | | 360/97.12 |
| 2007/0221815 | A1 | 9/2007 | Fujimoto et al. | |
| 2011/0149508 | A1* | 6/2011 | Malekmadani | H05K 7/1489 |
| | | | | 361/679.48 |
| 2014/0078661 | A1* | 3/2014 | Wu | G06F 1/20 |
| | | | | 361/679.31 |
| 2014/0123576 | A1* | 5/2014 | Meyer | E04F 15/02452 |
| | | | | 52/126.6 |
| 2014/0252197 | A1 | 9/2014 | Doglio | |
| 2014/0299737 | A1 | 10/2014 | Okumura | |
| 2016/0198565 | A1 | 7/2016 | Smith | |

* cited by examiner

VIBRATION SHOCK MITIGATION FOR COMPONENTS IN A SERVER RACK

BACKGROUND

Field of the Invention

The field of the invention is server rack management, or, more specifically, methods, apparatus, and products for vibration shock mitigation for components in a server rack.

Description of Related Art

Server racks may be shipped with server component chassis already installed to reduce the time necessary for the customer to install the system into a data center. Server component chassis include sensitive electronic elements that generally require delicate handling. Shipping the server component chassis within a server rack introduces potential contact between the installed server component chassis, which may cause damage during transport. Additionally, excess materials used to prevent contact during shipping must be disposed of or stored by the customer once the server rack is unpacked.

SUMMARY

Methods, systems, and apparatus for vibration shock mitigation for components in a server rack are disclosed in this specification. Vibration shock mitigation for components in a server rack includes a server rack comprising: a first server component chassis and a second server component chassis installed in adjacent locations within the server rack; and a chassis gap filler comprising: an elastic dampening sheet configured for placement between the first server component chassis and the second server component chassis, wherein the elastic dampening sheet is further configured to cover a portion of one side of the first server component chassis; and at least two attachment points configured to secure the elastic dampening sheet to the server rack.

Vibration shock mitigation for components in a server rack also includes a server rack comprising: a server component chassis; and a stabilizing bar attached to a top portion of the server rack and a bottom portion of the server rack comprising a flange attached to a center portion of the server component chassis.

Vibration shock mitigation for components in a server rack also includes a server rack comprising: a server component chassis; and a shipping bracket tip plate comprising: a first face comprising a first attachment point configured to secure the shipping bracket tip plate to the server rack; and a second face comprising a second attachment point configured to secure the shipping bracket tip plate to a surface external to the server rack.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
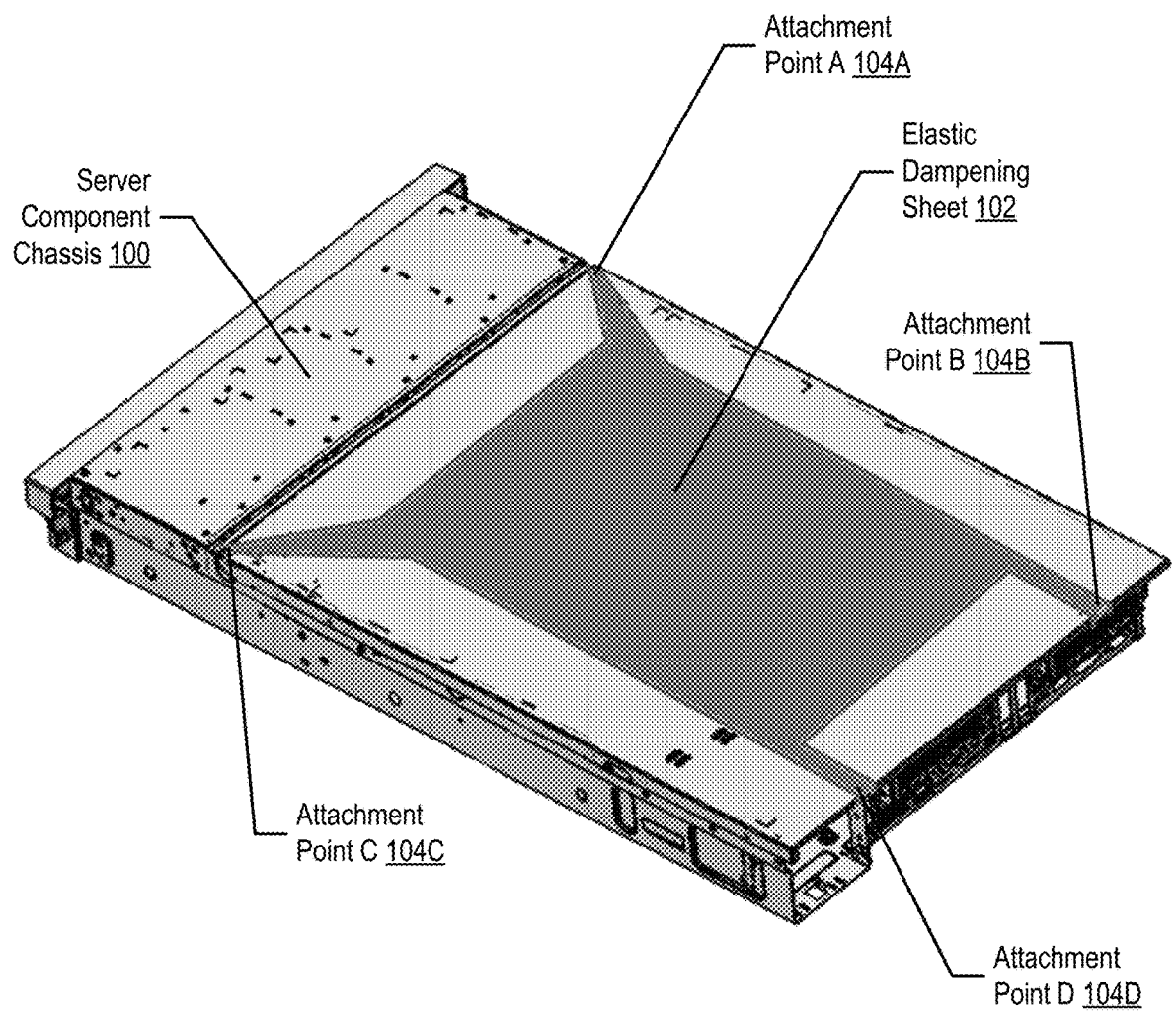
FIG. 1 depicts a perspective view of an example system for vibration shock mitigation for components in a server rack according to embodiments of the present invention.
Figure 2:
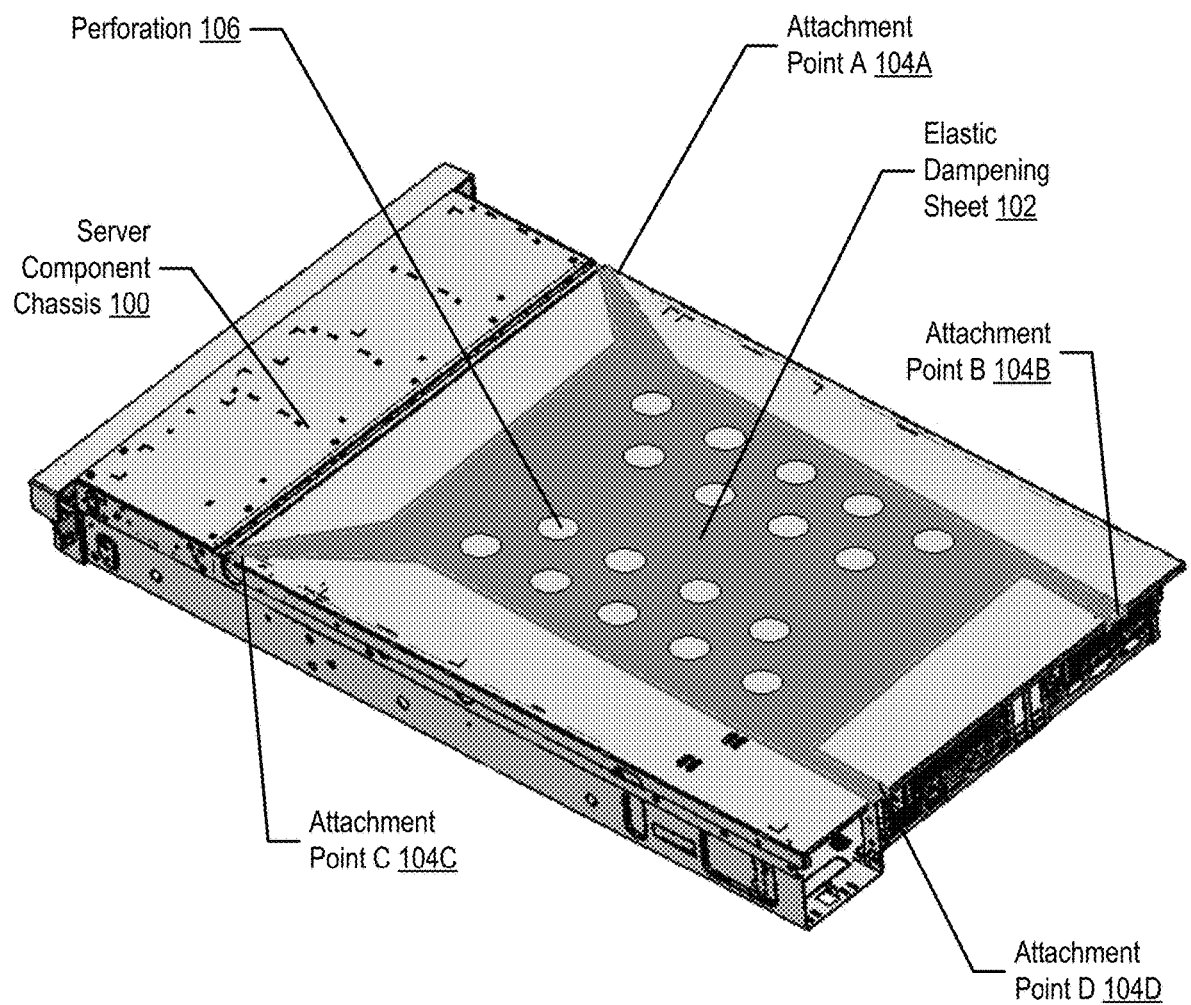
FIG. 2 depicts a perspective view of an example system for vibration shock mitigation for components in a server rack in accordance with embodiments of the present invention.

Exemplary products for vibration shock mitigation for components in a server rack in accordance with the present invention are described with reference to the accompanying drawings, beginning with FIGS. 1 and 2. FIGS. 1 and 2 set forth perspective views of an example chassis gap filler for vibration shock mitigation for components in a server rack in accordance with the present invention. The chassis gap filler includes an elastic dampening sheet (102) and multiple attachment points (attachment point A (104A), attachment point B (104B), attachment point C (104C), attachment point D (104D)) that connect the elastic sheet (102) to the server component chassis (100).

A server rack is a structure for mounting electrical or electronic equipment. Specifically, a server rack is a structure for mounting server component chassis. A server component chassis is a mechanical structure designed to house electrical and electronic components. Server component chassis may house, for example, all or part of a computing system, networking hardware, input devices, or output devices.

Prior to shipping, multiple server component chassis (e.g., server component chassis (100)) may be mounted into a server rack such that the server rack and server component chassis may be installed in a data center without further positional changes by the customer. The server rack may then be shipped to the customer with the server component chassis (e.g., server component chassis (100)) installed.

The chassis gap filler of FIGS. 1 and 2 that includes the elastic dampening sheet (102) and attachment points (attachment point A (104A), attachment point B (104B), attachment point C (104C), attachment point D (104D)) is a device the prevents movement of one server component chassis relative to another server component chassis during shipping. The chassis gap filler also prevents direct contact between adjacent server component chassis during shipping. Specifically, the chassis gap filler absorbs vibration and dampens movement of the server component chassis above and below the chassis gap filler.

The chassis gap filler includes the elastic dampening sheet (102). The elastic dampening sheet (102) is a flat elastic material configured to cover at least a portion of one side of the server component chassis (100). The flat elastic material is elastic in that the material can fill variable gaps between server component chassis. Elastic materials may include, for example, rubber, neoprene, and plastic.

The elastic dampening sheet (102) may include a cavity between two outer sheets. Specifically, the elastic dampening sheet (102) may include a bladder with a cavity holding an element or material to aid in absorbing vibration. Such an element or material may be a gas, combination of gasses (e.g., air), or an elastic solid.

The elastic dampening sheet (102) may have an irregular thickness. Specifically, one portion of the elastic dampening sheet (102) may be a different thickness than at least one other portion of the elastic dampening sheet (102). For example, the center of the elastic dampening sheet (102) may be thicker than the edge of the elastic dampening sheet (102). Similarly, the elastic dampening sheet (102) may have different elasticities across the dampening sheet. Specifically, one portion of the elastic dampening sheet (102) may have a different elasticity than at least one other portion of the elastic dampening sheet (102). For example, the center of the elastic dampening sheet (102) may be firmer and less elastic than an edge of the elastic dampening sheet (102).

FIG. 2 shows an elastic dampening sheet (102) that is perforated. A perforation (106) is a hole, gap, or notch in the elastic dampening sheet (102). The perforations (106) in the elastic dampening sheet (102) may be placed to control the thickness of the elastic dampening sheet (102). The size, shape, number, and pattern of the perforations (106) may be changed based on the desired effect on the thickness and behavior of the elastic dampening sheet (102). For example, a greater number of perforations, or larger perforations, may be placed along the edges of the elastic dampening sheet (102), and fewer perforations, or a smaller number of perforations, may be placed toward the center of the elastic dampening sheet (102). Such a configuration may have the effect of the center of the elastic dampening sheet (102) being less compressible than the edges of the elastic dampening sheet (102).

The elastic dampening sheet (102) is configured for placement between two server component chassis (e.g., server component chassis (100)). The two server component chassis may be installed in adjacent locations on the server rack. Further, the two server component chassis may be installed in the server rack such that the distance between the bottom of one server component chassis and the top of another server component chassis is similar to the thickness of the elastic dampening sheet (102).

The elastic dampening sheet is held in place using at least two attachment points (attachment point A (104A), attachment point B (104B), attachment point C (104C), attachment point D (104D)). Each attachment point is a piece of material, a device, or combination thereof that secures the elastic dampening sheet to a server component chassis (100) or other point on the server rack. As shown in FIGS. 1 and 2, each attachment point (attachment point A (104A), attachment point B (104B), attachment point C (104C), attachment point D (104D)) is connected to a corner of the elastic dampening sheet (102) and to the server component chassis (100).

The chassis gap filler may include two or more attachment points (attachment point A (104A), attachment point B (104B), attachment point C (104C), attachment point D (104D)). One or more of the attachment points may be configured to secure the elastic dampening sheet (102) to a server component chassis (either above or below the chassis gap filler). For example, the attachment point may be secured to a corner or edge of the server component chassis. One or more of the attachment points may be configured to secure the elastic dampening sheet (102) to a mounting rail of the server rack. Further, one or more of the attachment points may be configured to secure the elastic dampening sheet (102) to another portion of the server rack, such as chassis guides, slide rails, panels, or mounting flanges.

The attachment points may include clips configured to secure the elastic dampening sheet (102) to the server component chassis (100) or other part of the server rack, such as a mounting rail. A clip is a device that secures one end of the attachment point to the server component chassis (100) or other part of the server rack. The clip may be, for example, a clasp, hook, catch, or buckle.

The attachment points may include perforations configured to secure the elastic dampening sheet (102) to the server component chassis (100) or other part of the server rack, such as a mounting rail. The perforation may be used in conjunction with a clip, feature on the server component chassis (102), or other part of the server rack to secure the attachment points to the server component chassis (102) or other part of the server rack. For example, a perforation on an attachment point may be placed over a hook on the server component chassis (100) to secure the attachment point and elastic dampening sheet (102) to the server component chassis (100).

The attachment points may include an adhesive configured to secure the elastic dampening sheet (102) to the server component chassis (100) or other part of the server rack, such as a mounting rail. An adhesive is a substance used to stick an attachment point to the server component chassis (100) or other part of the server rack. The adhesive may be permanent, single use, or resealable. The adhesive may be, for example, a glue, fixative, gum, paste, or cement.

Multiple chassis gap fillers may be manufactured on a continuous sheet of elastic material. Each chassis gap filler may be separated from the continuous sheet of elastic material using seam indicators or perforations. Further, a user may select an appropriately sized chassis gap filler by separating a suitable number of sheets from the continuous roll.

Figure 3:
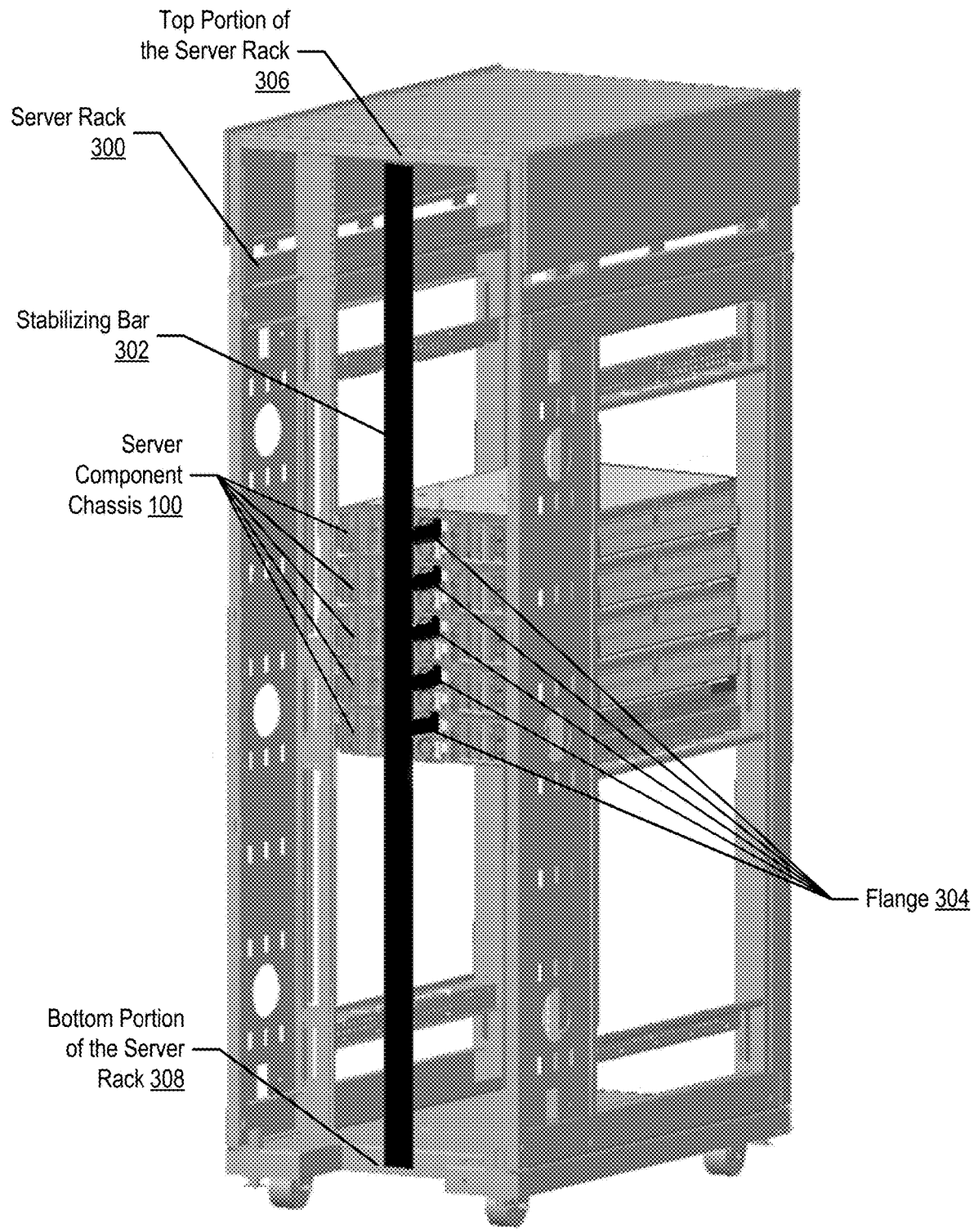
FIG. 3 depicts a perspective view of an example system for vibration shock mitigation for components in a server rack in accordance with embodiments of the present invention.

FIG. 3 sets forth a perspective view of an example stabilizing bar for vibration shock mitigation for components in a server rack in accordance with the present invention. The stabilizing bar (302) is attached to a top portion of the server rack (306) and a bottom portion of the server rack (308). The stabilizing bar (302) includes multiple flanges (304) attached to a center portion of the server component chassis (100). FIG. 3 shows five flanges (304) attached to the stabilizing bar (302). However, the stabilizing bar (302) may include any number of flanges (304).

The stabilizing bar (302) is a ridged rack-level shipping bracket configured to mitigate movement of one or more server component chassis (100) installed in a server rack (300). The stabilizing bar (302) may be plastic, metal, a combination of plastic and metal, or another ridged material or combination of materials. The stabilizing bar (302) may lock the server component chassis (100) in place by creating an upward, downward, or centralizing force on the server component chassis (100) in order to minimize vibration.

The stabilizing bar (302) may be attached to any part of the top portion of the server rack (306). Similarly, the stabilizing bar (302) may be attached to any part of the bottom portion of the server rack (308). The top portion of the server rack (306) and the bottom portion of the server rack (308) may include side railings of the server rack (300). The stabilizing bar (302) may be attached to the server rack mechanically or using an adhesive. Further, the stabilizing bar (302) may be placed on any side of the server rack (300).

Each flange (304) may be adjustable relative to the stabilizing bar (302). Specifically, each flange (304) may move freely during attachment to the server component chassis (100). Once the flange (304) is attached to a server component chassis (100), the flange may be locked in place mechanically relative to the stabilizing bar (302).

One or more flanges (304) may include a friction absorbing element or dampener to absorb friction between the stabilizing bar (302) and the server component chassis (100). The friction absorbing element may be a mechanical or hydraulic device designed to absorb and dampen shock impulses. Alternatively, the friction absorbing element may be a material with friction absorbing properties, such as rubber.

The flange (304) may be mechanically attached to the center portion of the server component chassis (100). Specifically, the flange (304) may include a clip, such as a hook, that attaches to the server component chassis (100). For example, the server component chassis (100) may include a hole drilled in the center back of the chassis. The flange (304) may be designed with a hook with a corresponding shape to fit into the center back hole of the server component chassis (100).

The flange (304) may be attached to the center portion of the server component chassis (100) using an adhesive. Specifically, the flange (304) may include a face with an adhesive substance configured to attach to the server component chassis (100). For example, the server component chassis (100) may include a flat square section the center back of the chassis. The flange (304) may be designed with a corresponding flat square section that includes an adhesive substance to attach to the server component chassis (100).

An injection mold may be used in manufacturing a stabilizing bar for vibration shock mitigation for components in a server rack in accordance with embodiments of the present invention. An example injection mold may include three portions: a top, a bottom, and slides. The top side is configured to be placed on the bottom side. The slides are then configured to be inserted within the slide cavities. When all parts placed and installed, the injection mold forms a cavity. The cavity is configured to receive liquid, injected material and has a shape defined by a stabilizing bar. That is, the cavity defines the outer dimension of a stabilizing bar that attaches to a top portion of the server rack and a bottom portion of the server rack, and comprises a flange configured to attach to a center portion of a server component chassis.

Figure 4:
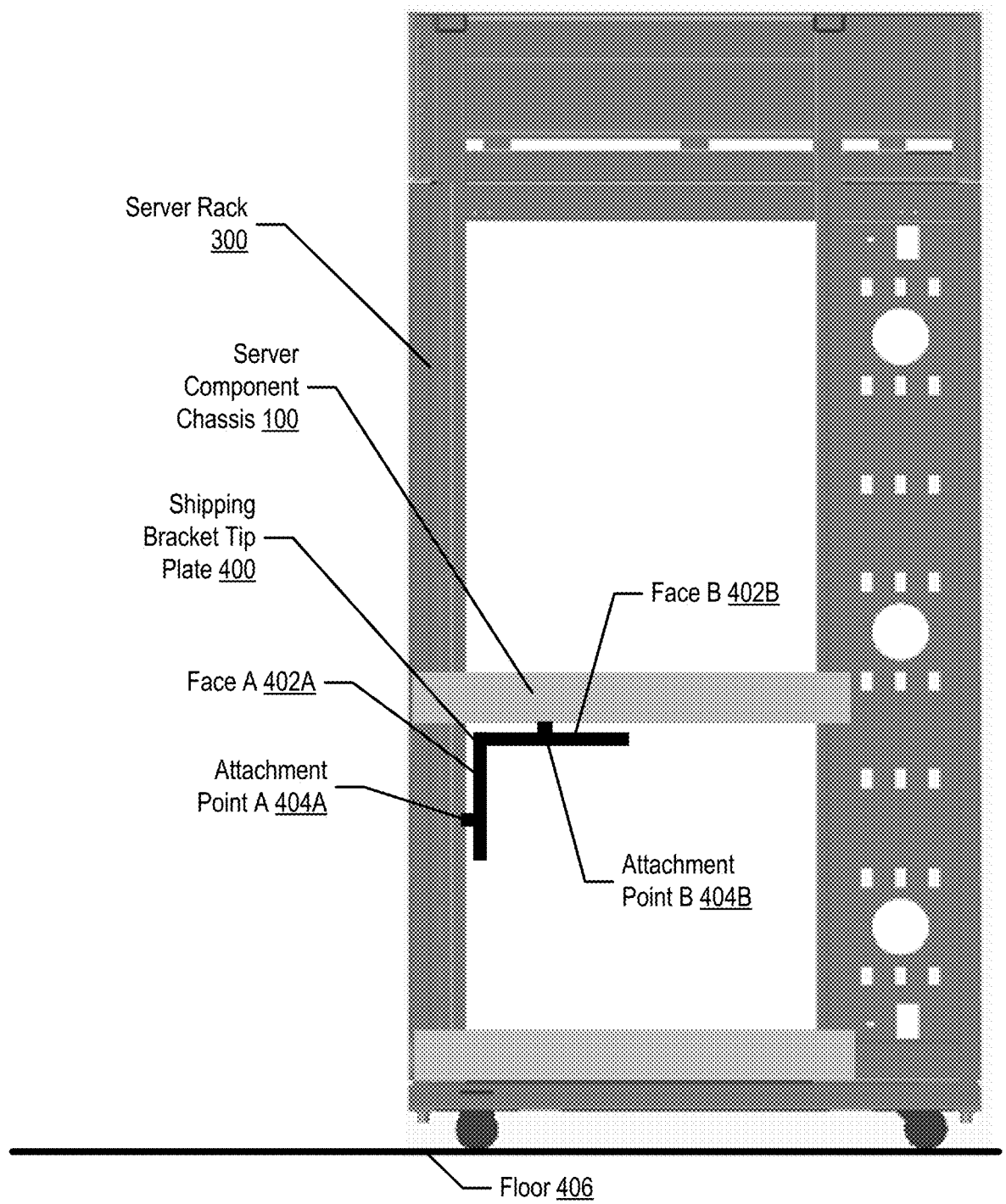
FIG. 4 depicts a side view of an example system for vibration shock mitigation for components in a server rack in accordance with embodiments of the present invention.
Figure 5:
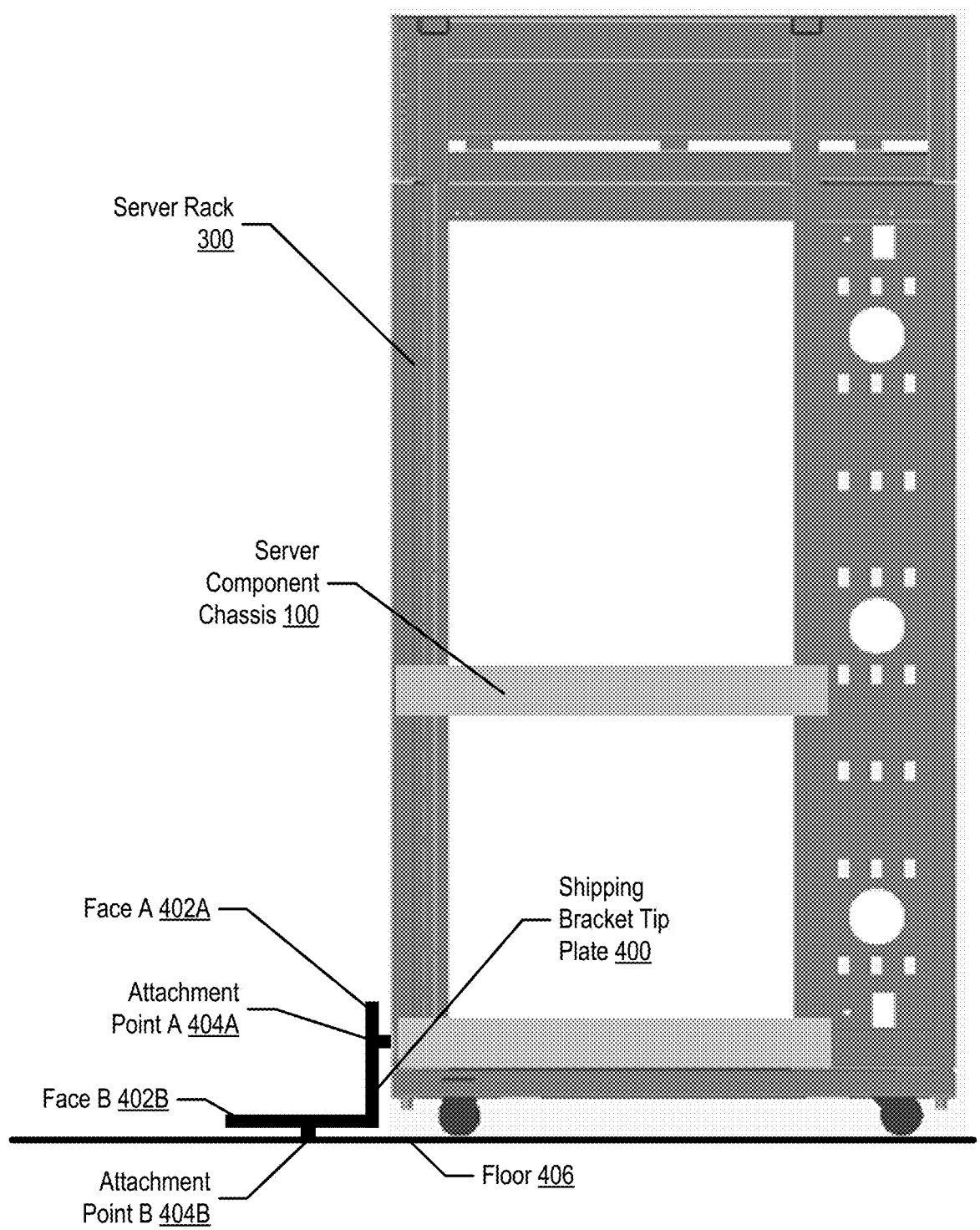
FIG. 5 depicts a side view of an example system for vibration shock mitigation for components in a server rack in accordance with embodiments of the present invention.

FIGS. 4 and 5 set forth side views of an example shipping bracket tip plate for vibration shock mitigation for components in a server rack in accordance with the present invention. As shown in FIGS. 4 and 5, the server rack (300) is resting on the floor (406) and includes a server component chassis (100). The server component chassis (100) is secured for shipment using the shipping bracket tip plate (400). The shipping bracket tip plate (400) shown in FIGS. 4 and 5 includes two faces (face A (402A), face B (402B)), and each face includes an attachment point (attachment point A (404A), attachment point B (404B)). Attachment point A (404A) of face A (402A) of the shipping bracket tip plate (400) is configured to secure the shipping bracket tip plate (400) to the server rack (300). Attachment point B (404B) of face B (402B) of the shipping bracket tip plate (400) is configured to secure the shipping bracket tip plate (400) to a surface external to the server rack. Note that the gaps between face A (402A) and the server rack, and between face B (402B)) and the server component chassis (100) are shown to clearly depict the attachment points (attachment point A (404A), attachment point B (404B)). A gap may be present, or the faces may be flush against the corresponding elements. Further, face A (402A), face B (402B), attachment point A (404A), and/or attachment point B (404B) may include a dampening material in order to absorb vibrational energy or friction between the shipping bracket tip plate (400) and the server rack (300), server component chassis (100), or the floor (406).

FIG. 4 shows the example shipping bracket tip plate (400) installed as a shipping bracket. A shipping bracket is a device configured to minimize movement of a server component chassis (100) relative to the server rack (300) by rigidly connecting the server component chassis (100) to the server rack. While installed as a shipping bracket, one attachment point (attachment point A (404A)) on one face (face A (402A)) is configured to secure the shipping bracket tip plate (400) to the server rack (300). Another attachment point (attachment point B (404B)) on another face (face B (402B)) may be configured to secure the shipping bracket tip plate (400) to the server component chassis (100). Although FIG. 4 depicts face B (402B) as including attachment point B (404B), face B (402B) may support the server component chassis (100) without an attachment point.

FIG. 5 shows the shipping bracket tip plate (400) installed as a tip plate. A tip plate is a device configured to prevent a server rack (300) from tipping over by rigidly connecting the server rack (300) to a surface external to the server rack (e.g., the floor (406)). Although FIG. 5 shows the shipping bracket tip plate (400) installed as a tip plate in the front of the server rack (300), the shipping bracket tip plate (400) may be installed as a tip plate on any side of the server rack (300) and to any external surface. Further, multiple shipping bracket tip plates (400) may be combined into a single installed tip plate.

While installed as a tip plate, one attachment point (attachment point A (404A)) on one face (face A (402A)) is configured to secure the shipping bracket tip plate (400) to the server rack (300). Another attachment point (attachment point B (404B)) on another face (face B (402B)) is configured to secure the shipping bracket tip plate (400) to a surface external to the server rack (the floor (406)). Surfaces external to the server rack may include, for example, the floor (406) or wall (e.g., of a data center), or a support element attached to the floor or wall. Although FIG. 5 depicts face A (402A) attached to the server rack (300) and face B (402B) attached to the floor (406), face B (402B) may be attached to the server rack (300) and face A (402A) may be attached to the floor (406).

Each attachment point on each face may be configured to secure the shipping bracket tip plate (400) to the server rack (300), server component chassis (100), a surface external to the server rack, or any combination thereof. Further, the shipping bracket tip plate (400) may include any number of attachment points. One or more attachment points may be perforations configured to receive fasteners, such as a screw. One or more attachment points may include clips, such as hooks, with corresponding receptacles located on the server rack (300), server component chassis (100), or floor (406).

One or more of the attachment points may be configured to secure the shipping bracket tip plate (400) to more than one target (e.g., both a surface external to the server rack (300) and the server component chassis (100)). For example, one attachment point (e.g., attachment point B (404)) may have dual-use configurations, such as being configured to secure the shipping bracket tip plate (400) to the server component chassis (100) and being configured to secure the shipping bracket tip plate (400) to the floor (406).

The shipping bracket tip plate (400) may include different attachment points each configured to secure the shipping bracket tip plate (400) to a different target. For example, the shipping bracket tip plate (400) may include a first attachment point configured to secure the shipping bracket tip plate (400) to the server rack (300), a second attachment point configured to secure the shipping bracket tip plate (400) to the server component chassis (100), and a third attachment point configured to secure the shipping bracket tip plate (400) to the floor (406).

An injection mold may be used in manufacturing a shipping bracket tip plate for vibration shock mitigation for components in a server rack in accordance with embodiments of the present invention. An example injection mold may include three portions: a top, a bottom, and slides. The top side is configured to be placed on the bottom side. The slides are then configured to be inserted within the slide cavities. When all parts placed and installed, the injection mold forms a cavity. The cavity is configured to receive liquid, injected material and has a shape defined by a shipping bracket tip plate. That is, the cavity defines the outer dimension of a shipping bracket tip plate that includes a first face comprising a first attachment point configured to secure the shipping bracket tip plate to the server rack; and a second face comprising a second attachment point configured to secure the shipping bracket tip plate to a surface external to the server rack.

Figure 6:
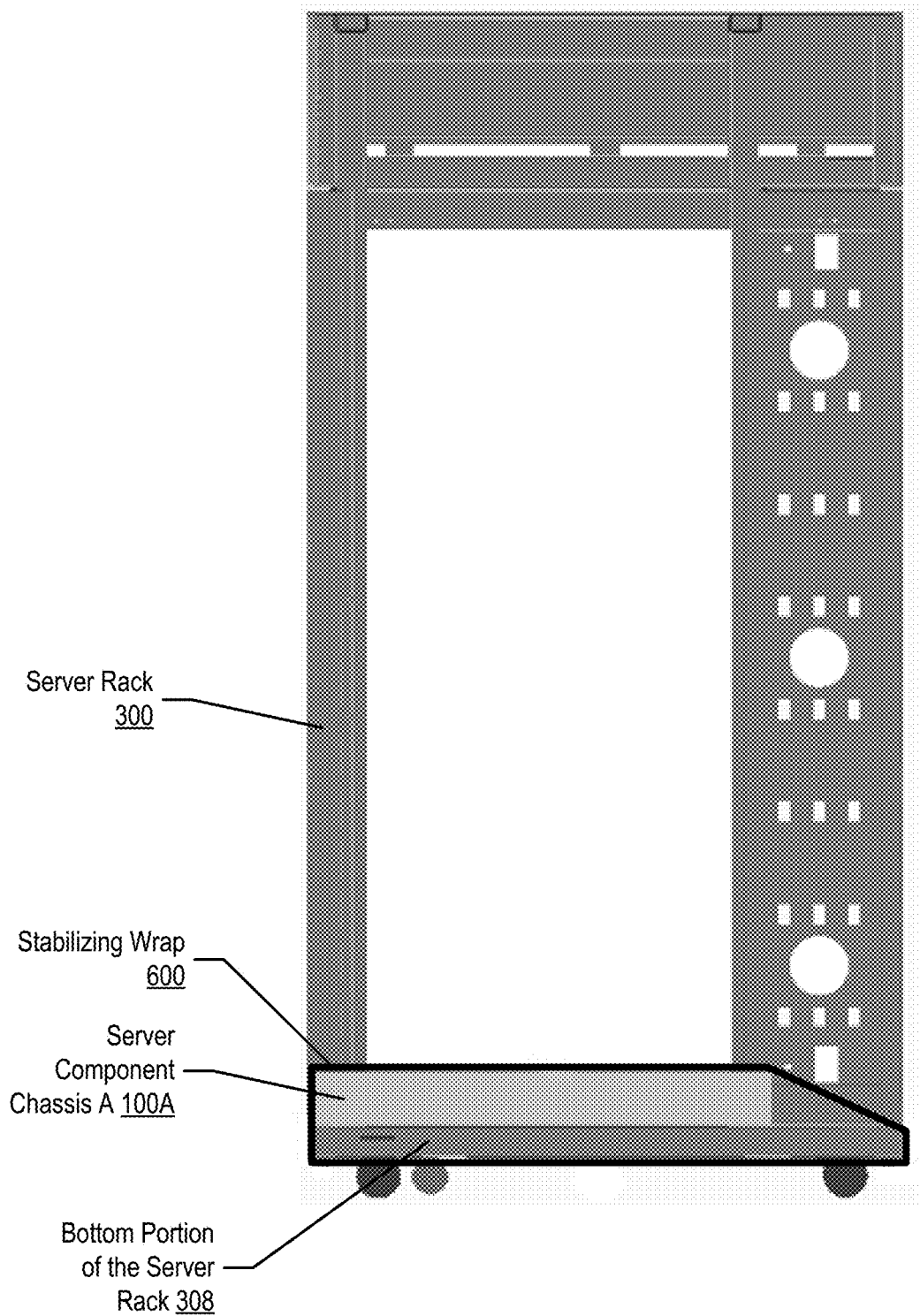
FIG. 6 depicts a side view of an example system for vibration shock mitigation for components in a server rack in accordance with embodiments of the present invention.
Figure 7:
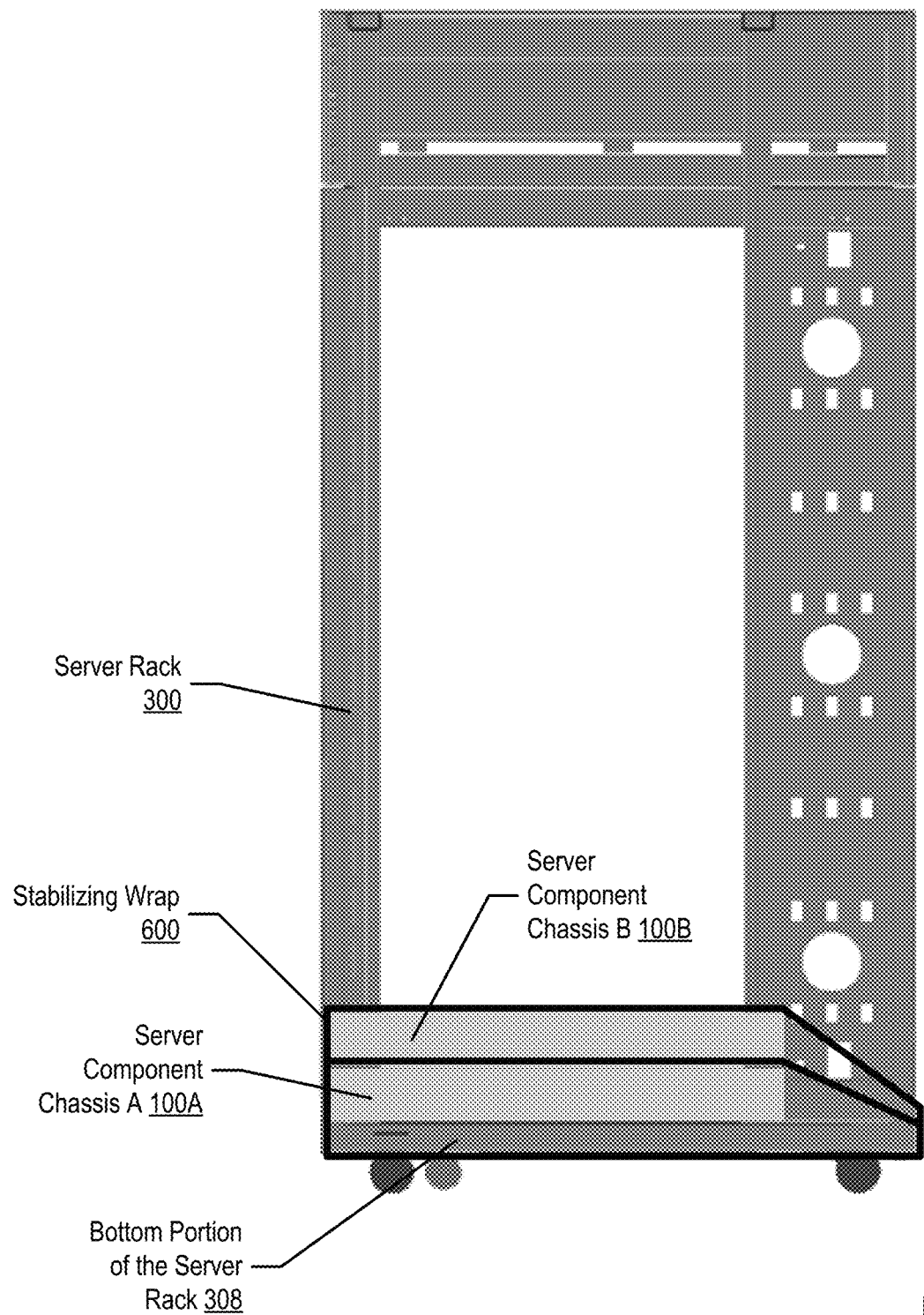
FIG. 7 depicts a side view of an example system for vibration shock mitigation for components in a server rack in accordance with embodiments of the present invention.
Figure 8:
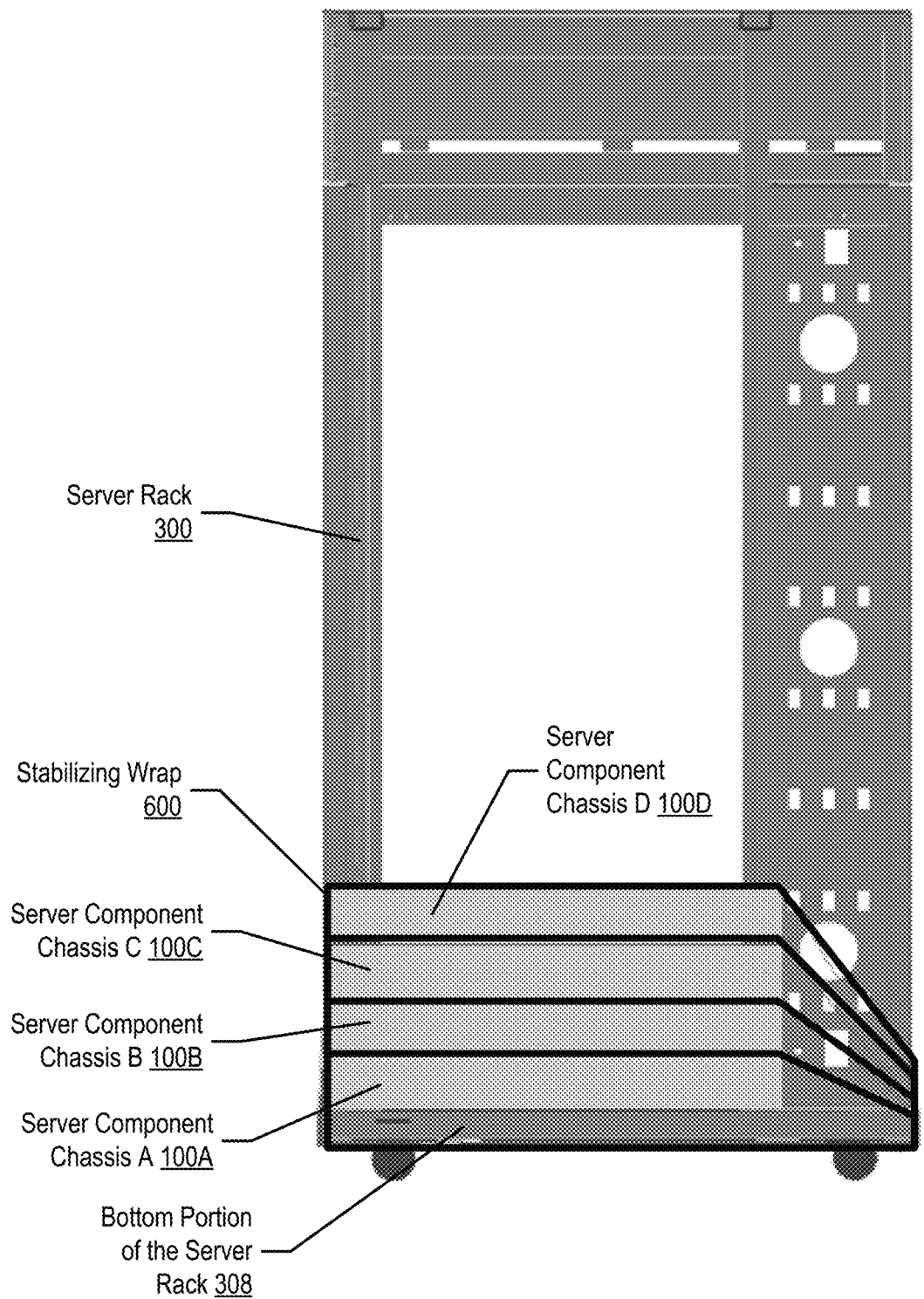
FIG. 8 depicts a side view of an example system for vibration shock mitigation for components in a server rack in accordance with embodiments of the present invention.

FIGS. 6, 7, and 8 set forth side views of a stabilizing wrap for vibration shock mitigation for components in a server rack in accordance with the present invention. The stabilizing wrap (600) is an elastic material that secures one or more server component chassis (e.g., server component chassis A (100A)) to the server rack (300) and to each other. The elastic material may be, for example, plastic wrap, shrink wrap, stretch wrap, stretch film, permeable foam wrap, or packing wrap. The elastic material may also include dampening properties. Further, different widths and thicknesses of stabilizing wrap (600) may be used. The stabilizing wrap (600) may also be a continuous sheet of elastic material that is wrapped over the top portion of a first server component chassis, under the bottom portion of the server rack, then wrapped over the top portion of a (subsequently installed) second server component chassis.

As shown in FIG. 6, the stabilizing wrap (600) may be wrapped around both server component chassis A (100A) and the bottom portion of the server rack (308), securing server component chassis A (100A) to the bottom portion of the server rack (308). As shown in FIG. 7, once the stabilizing wrap (600) has secured server component chassis A (100A) to the bottom portion of the server rack (308), server component chassis B (100B) may be installed into the server rack (300). The stabilizing wrap (600) may then be wrapped over the top portion of server component chassis B (100B) and under the bottom portion of the server rack (308) (over the previously placed stabilizing wrap (600)).

As shown in FIG. 8, server component chassis C (100C) is subsequently installed into the server rack (300). The stabilizing wrap (600) may then be wrapped over the top portion of server component chassis C (100C) and under the bottom portion of the server rack (308) (over the two layers of previously placed stabilizing wrap (600)). Once the stabilizing wrap (600) has secured server component chassis C (100C) to server component chassis B (100B), server component chassis A (100A), and the bottom portion of the server rack (308), server component chassis D (100D) may be installed into the server rack (300). The stabilizing wrap (600) may then be wrapped over the top portion of server component chassis D (100D) and under the bottom portion of the server rack (308) (over the three layers of previously placed stabilizing wrap (600)).

Although FIGS. 6, 7, and 8 show the stabilizing wrap (600) wrapped over the top portion of a server component chassis and under the bottom portion of the server rack (308), the stabilizing wrap (600) may be applied in other configurations. For example, the stabilizing wrap (600) may be wrapped over the bottom portion of a server component chassis and over the top portion of the server rack. Further, not every installed server component chassis may be wrapped with the stabilizing wrap (600). For example, every other server component chassis may be wrapped or the top and bottom server component chassis may be wrapped.

Figure 9:
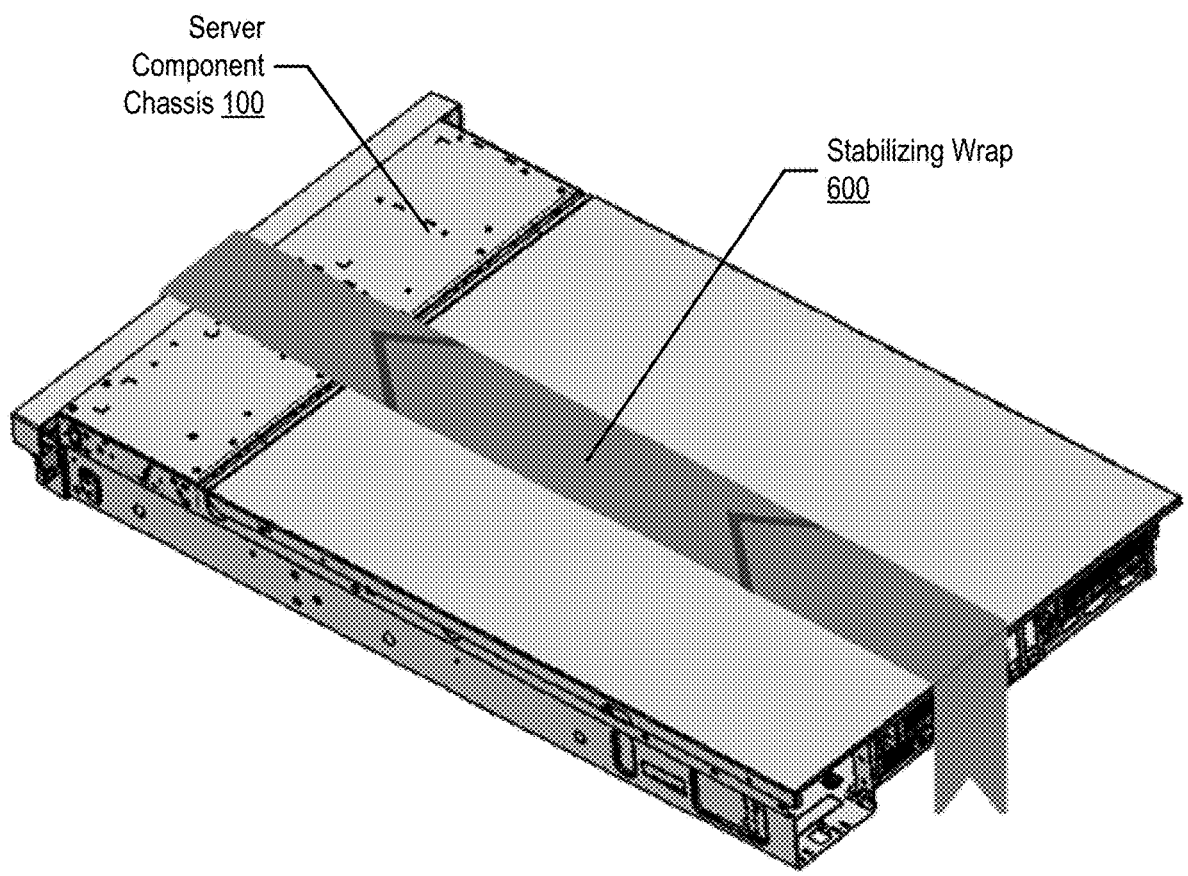
FIG. 9 depicts a perspective view of an example system for vibration shock mitigation for components in a server rack in accordance with embodiments of the present invention.
Figure 10:
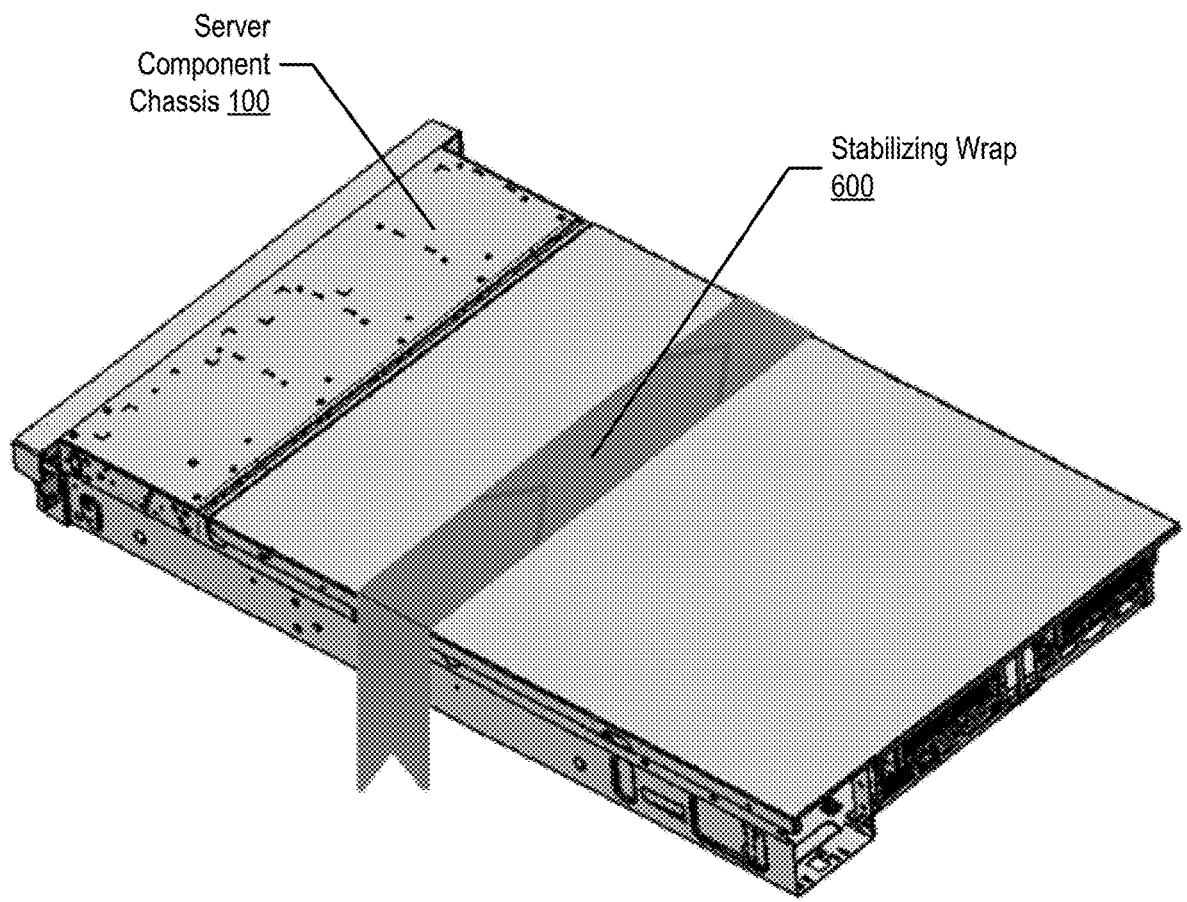
FIG. 10 depicts a perspective view of an example system for vibration shock mitigation for components in a server rack in accordance with embodiments of the present invention.
Figure 11:
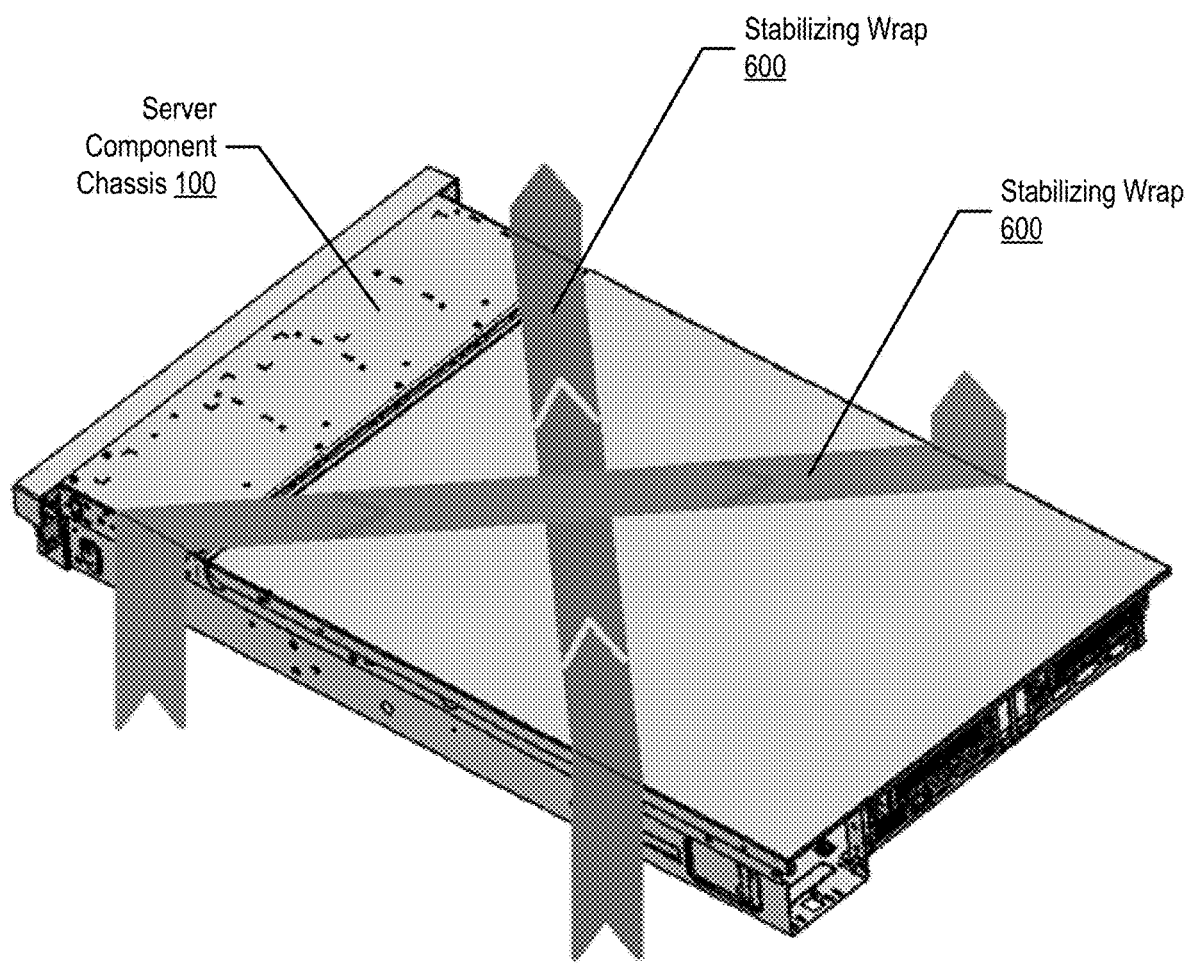
FIG. 11 depicts a perspective view of an example system for vibration shock mitigation for components in a server rack in accordance with embodiments of the present invention.

FIGS. 9, 10, and 11 set forth perspective views of a stabilizing wrap for vibration shock mitigation for components in a server rack in accordance with the present invention. Specifically, FIGS. 9, 10, and 11 show different methods of applying the stabilizing wrap (600) over the top portion of the server component chassis (100). As shown in FIG. 9, the stabilizing wrap (600) may be wrapped over the top portion of the server component chassis (100) from the rear of the server component chassis (100) to the front of the server component chassis (100). Alternatively, the stabilizing wrap (600) may be wrapped over the top portion of the server component chassis (100) from the front of the server component chassis (100) to the rear of the server component chassis (100).

FIG. 10 shows an alternative method of wrapping a server component chassis (100) with the stabilizing wrap (600). As shown in FIG. 10, the stabilizing wrap (600) may be wrapped over the top portion of the server component chassis (100) from one side of the server component chassis (100) to the other side of the server component chassis (100). After the server rack is installed, if the server component chassis (100) is wrapped with the stabilizing wrap (600) from one side to the other side, the stabilizing wrap may be left in place while the server component chassis (100) is operational because the stabilizing wrap would not block access to the server component chassis (100).

FIG. 11 shows an alternative method of wrapping a server component chassis (100) with the stabilizing wrap (600). As shown in FIG. 11, the stabilizing wrap (600) may be wrapped in a crisscross pattern over the top portion of the server component chassis (100). Specifically, a first pass of the stabilizing wrap (600) may proceed from the rear right corner to the front left corner, and a second pass of the stabilizing wrap (600) may proceed from the front right corner to the rear left corner. Similarly, the first pass of the stabilizing wrap (600) may proceed from the rear left corner to the front right corner, and a second pass of the stabilizing wrap (600) may proceed from the front left corner to the rear right corner.

Although the stabilizing wrap (600) is described above as being wrapped over the top portion of the server component chassis (100) and the bottom portion of the server rack (308), the stabilizing wrap (600) may instead be wrapped over the bottom portion of the server component chassis (100) and the top portion of the server rack. Further, the stabilizing wrap (600) may be used in conjunction with other vibration shock mitigation devices, such as the shipping bracket tip plate described in FIGS. 4 and 5.

In view of the explanations set forth above, readers will recognize that the benefits of vibration shock mitigation for components in a server rack according to embodiments of the present invention include:

Improving the shipping process of a server rack by stabilizing server component chassis within the server rack such that the server rack may be safely shipped with server component chassis preinstalled, increasing efficiency for the customer.

Improving the shipping process of a server rack by stabilizing server component chassis within the server rack, reducing damage to shipped server components and increasing efficiency.

Improving the shipping process of a server rack by providing dual-use shipping brackets, reducing waste and increasing efficiency for the customer.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A server rack comprising:
   a first server component chassis and a second server component chassis installed in adjacent locations within the server rack; and
   a chassis gap filler configured to fill variable gaps between server component chassis, wherein the chassis gap filler is further configured to prevent movement of the first server component chassis relative to the second server component chassis during shipping, wherein the chassis gap filler is further configured to prevent direct contact between the first server component chassis and the second server component chassis during shipping, the chassis gap filler comprising:
   an elastic dampening sheet configured for placement directly between the first server component chassis and the second server component chassis, wherein the elastic dampening sheet is further configured to be in direct contact with both the first server component chassis and the second server component chassis, wherein the elastic dampening sheet is further configured to cover a portion of one side of the first server component chassis; and
   at least two attachment points configured to secure the elastic dampening sheet to the server rack.

2. The server rack of claim 1, wherein the elastic dampening sheet is perforated.

3. The server rack of claim 1, wherein at least one of the at least two attachment points is configured to secure the elastic dampening sheet to the first server component chassis.

4. The server rack of claim 1, wherein at least one of the at least two attachment points is configured to secure the elastic dampening sheet to a mounting rail of the server rack.

5. The server rack of claim 1, wherein the elastic dampening sheet has an irregular thickness.

6. The server rack of claim 1, wherein the at least two attachment points each comprise clips configured to secure the elastic dampening sheet to one selected from a group consisting of the first server component chassis and a mounting rail of the server rack.

7. The server rack of claim 1, wherein the at least two attachment points each comprise an adhesive configured to secure the elastic dampening sheet to one selected from a group consisting of the first server component chassis and a mounting rail of the server rack.

8. A server rack comprising:
   a server component chassis within the server rack; and
   a shipping bracket tip plate comprising:
   a first face comprising a first attachment point configured to secure the shipping bracket tip plate to the server rack; and
   a second face comprising a second attachment point configured to secure the shipping bracket tip plate to a surface external to the server rack, wherein the second attachment point is further configured to secure the shipping bracket tip plate to the server component chassis within the server rack.

9. The server rack of claim 8, wherein the first attachment point and the second attachment point are perforations configured to receive fasteners.

10. The server rack of claim 8, wherein the shipping bracket tip plate further comprises a third attachment point configured to secure the shipping bracket tip plate to the server component chassis.

11. The server rack of claim 8, wherein the surface external to the server rack is a floor of a data center.

* * * * *